US012520516B2

(12) United States Patent
Teo et al.

(10) Patent No.: US 12,520,516 B2
(45) Date of Patent: Jan. 6, 2026

(54) SEMICONDUCTOR DEVICE WITH A CHANGEABLE POLARIZATION DIRECTION

(71) Applicant: Mitsubishi Electric Research Laboratories, Inc., Cambridge, MA (US)

(72) Inventors: Koon Hoo Teo, Lexington, MA (US); Nadim Chowdhury, Cambridge, AL (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 428 days.

(21) Appl. No.: 18/052,776

(22) Filed: Nov. 4, 2022

(65) Prior Publication Data

US 2024/0162338 A1    May 16, 2024

(51) Int. Cl.
*H10D 30/47*      (2025.01)
*H10D 30/67*      (2025.01)
*H10D 62/824*     (2025.01)
*H10D 62/85*      (2025.01)
*H10D 64/23*      (2025.01)
(Continued)

(52) U.S. Cl.
CPC ....... *H10D 30/475* (2025.01); *H10D 30/6738* (2025.01); *H10D 30/675* (2025.01); *H10D 62/824* (2025.01); *H10D 62/85* (2025.01); *H10D 62/8503* (2025.01);
(Continued)

(58) Field of Classification Search
CPC .... H10D 30/475; H10D 30/675; H10D 64/62; H10D 64/251; H10D 64/64; H10D 62/824
See application file for complete search history.

(56) References Cited

U.S. PATENT DOCUMENTS 7,952,117 B2    5/2011  Masuda
11,069,802 B2   7/2021  Hwang et al.
(Continued)

OTHER PUBLICATIONS

Chen, Dingbo, et al. "Ohmic contact to AlGaN/GaN HEMT with electrodes in contact with heterostructure interface." Solid-State Electronics 151 (2019): 60-64. (Year: 2019).*
(Continued)

*Primary Examiner* — Jacob Y Choi
*Assistant Examiner* — Aaron Michael Wegner
(74) *Attorney, Agent, or Firm* — Gene Vinokur

(57) ABSTRACT

The present disclosure discloses a semiconductor device comprising a plurality of epitaxial layers including a barrier layer and a channel layer such that two-dimensional carrier densities are formed at an interface of the barrier layer and the channel layer, wherein a priority of charge carriers of the channel layer is based on a polarization direction of the barrier layer, and wherein the polarization direction of the barrier layer can be changed by applying an electric field across the barrier layer. The semiconductor device further comprises a first source terminal and a second source terminal, wherein in one of the first source terminal and the second source terminal is ohmic to electrons and other one is ohmic to holes. The semiconductor device further comprises a first drain terminal and a second drain terminal, a gate terminal, and a set terminal ohmic to the channel layer.

11 Claims, 13 Drawing Sheets

(51) Int. Cl.
   *H10D 64/62* (2025.01)
   *H10D 64/64* (2025.01)
(52) U.S. Cl.
   CPC .......... *H10D 64/251* (2025.01); *H10D 64/62* (2025.01); *H10D 64/64* (2025.01)

(56) References Cited

U.S. PATENT DOCUMENTS

| | | | |
|---|---|---|---|
| 2014/0264380 A1* | 9/2014 | Kub | H10D 84/05 |
| | | | 257/77 |
| 2017/0338810 A1* | 11/2017 | Chen | H10D 30/4755 |
| 2021/0305374 A1* | 9/2021 | Teo | H10D 62/8503 |
| 2022/0109064 A1 | 4/2022 | Arkun et al. | |
| 2022/0262937 A1 | 8/2022 | Logan et al. | |
| 2024/0242963 A1* | 7/2024 | Mi | C23C 16/303 |

OTHER PUBLICATIONS

Lee, Hyunjea. "Toward III-Nitride Based Ferroelectric High Electron Mobility Transistors." (2022). (Year: 2022).*

Matthew T. Hardy et, al., "Epitaxial ScAlN Grown by Molecular Beam Epitaxy on GaN and SiC Substrates", Applied Physics Letters, vol. 110, Issue 16, (2017), pp. 1-18.

Kathrin Frei et, al., "Investigation of Growth Parameters for ScaIn-Barrier HEMT Structures by Plasma-Assisted MBE", Japanese Journal of Applied Physics 58(SC), (2019), pp. 1-16.

* cited by examiner

SEMICONDUCTOR DEVICE WITH A CHANGEABLE POLARIZATION DIRECTION

TECHNICAL FIELD

The present disclosure relates generally to semiconductor device, and more particularly to a semiconductor device with a changeable polarization direction.

BACKGROUND

Modern semiconductor devices, such as Metal Oxide Silicon Field Effect Transistors (MOSFETs), High Electron Mobility Transistors (HEMTs), and Insulated Gate Bipolar Transistors (IGBTs), have been typically fabricated with silicon (Si) semiconductor materials. However, silicon's limited critical electric field and relatively high resistance make currently available commercial power devices, circuits, and systems bulky, with further constraints on operating frequencies. Therefore, such commercial devices are unsuitable for different types of applications, for example, high power electronics applications.

III-N semiconductor devices have many advantages over silicon-based devices. For example, the III-N semiconductor devices can carry large currents, provide very low on-resistances, and operate at high voltages with fast switching times. The III-N semiconductor devices are made of III-Nitride materials. The III-Nitride materials possess a unique combination of physical properties that are useful in modern microelectronics and optoelectronics. Among these properties are wide bandgap, high saturated drift rate, high breakdown voltage, high thermal conductivity, remarkable chemical and thermal stability. Due to the aforesaid properties, the III-Nitride materials are used for fabrication of numerous electronic and optoelectronic devices.

However, despite the advantages of the III-Nitride materials, there are still many technological challenges that need to be addressed. For instance, it is difficult to control defects owing to lack of native substrates. Incorporating a high concentration of indium into $In_xGa_{1-x}N$ alloys remains challenging due to phase separation and a lattice mismatch between Gallium Nitride (GaN) and Indium Nitride (InN).

Therefore, there is still a need to explore characteristics of the III-Nitride materials and improve capability/functionality of the III-N semiconductor devices.

SUMMARY

It is an object of some embodiments to provide a single channel layer based III-N semiconductor device that can act as both p-channel Field-Effect Transistor (also referred to as p-FET) and n-channel Field-Effect Transistor (also referred to as n-FET). Additionally or alternatively, it is an object of some embodiments to provide a semiconductor device that acts as both p-FET and n-FET, and occupies less circuit area. Additionally or alternatively, it is an object of some embodiments to provide a semiconductor device that has a high switching speed.

Some embodiments provide a semiconductor device that includes epitaxial layers including a barrier layer and a channel layer. The semiconductor device further includes a plurality of terminals, for example, a first source terminal, a second source terminal, a gate terminal, a first drain terminal, a second drain terminal, and a set terminal. In an embodiment, the first source terminal is ohmic to electrons and the second source terminal is ohmic to holes. The first drain terminal is ohmic to the electrons and the second drain terminal is ohmic to the holes. In some alternate embodiments, the first source terminal is ohmic to the holes and the second source terminal is ohmic to the electrons, and the first drain terminal is ohmic to the holes and the second drain terminal is ohmic to the electrons. The first drain terminal and the second drain terminal are interconnected by an interconnect to form a single output terminal. The gate terminal is arranged on the barrier layer. The set terminal is ohmic to the channel layer.

Some embodiments are based on the recognition that, to work the semiconductor device as a p-FET, the channel layer should include the holes as majority charge carriers, and, to work the semiconductor device as a n-FET, the channel layer should include the electrons as the majority charge carriers. To that end, whether the semiconductor device acts as p-FET or n-FET depends on the majority charge carriers in the channel layer.

Some embodiments are based on the realization that a priority of charge carriers (i.e., majority charge carriers either holes or electrons) of the channel layer depends on a polarization direction of the barrier layer. According to an embodiment, the barrier layer is a III-Nitride compound layer, e.g., Scandium-doped Aluminum Nitride (ScAlN) layer. The ScAlN material has ferroelectricity characteristic. Ferroelectricity is a characteristic of materials that have a spontaneous electric polarization that can be reversed by application of an external electric field. All ferroelectrics are pyroelectric, with an additional property that their natural electrical polarization is reversible. To that end, the polarization direction of the barrier layer, which is the ScAlN layer, can be changed by application of an electric field across the barrier layer.

Since the majority charge carriers of the channel layer depends on the polarization direction of the barrier layer, and the polarization direction of the barrier layer can be changed by the electric field applied across the barrier layer, the electric field can be applied across the barrier layer to switch the polarization direction of the barrier layer such that the semiconductor device can be used as both n-FET and p-FET.

For example, a first voltage can be applied between the gate terminal and the set terminal to form a 2-dimensional electron gas (2-DEG) at the interface of the barrier layer and the channel layer. When there is 2-DEG at the interface of the barrier layer and the channel layer, the semiconductor device acts as n-FET. Similarly, a second voltage can be applied between the gate terminal and the set terminal to form a 2-dimensional hole gas (2-DHG) at the interface of the barrier layer and the channel layer. When there is 2-DHG at the interface of the barrier layer and the channel layer, the semiconductor device acts as p-FET. The second voltage is different from the first voltage. For instance, the first voltage applied between the gate terminal and the set terminal may correspond to a positive bias voltage, and the second voltage applied between the gate terminal and the set terminal may correspond to a negative bias voltage. In such a manner, the semiconductor device can act as both n-FET and p-FET.

In an embodiment, the channel layer is a Gallium Nitride (GaN) layer. Specifically, the channel layer corresponds to an unintentionally doped GaN layer. GaN is a binary III/V direct bandgap semiconductor and is a hard material that has a Wurtzite crystal structure. In an embodiment, the epitaxial layers (i.e., the barrier layer and the channel layer) are grown on the substrate by deposition methods. Examples of the substrate include a Sapphire substrate, a GaN substrate, a silicon substrate, and a Silicon Carbide (SiC) substrate. The deposition methods may, for example, include Molecular beam epitaxy (MBE). MBE is an epitaxial process by which growth of materials takes place under Ultra-High Vacuum (UHV) conditions on a heated crystalline substrate by an interaction of adsorbed species supplied by atomic or molecular beams. MBE provides several capabilities favorable for the growth of high-purity, epitaxial thin-film metals. For instance, the UHV conditions result in the highest achievable purity of the grown films.

In some embodiments, a material of the first source terminal and the first drain terminal is different from a material of the second source terminal and the second drain terminal. In other words, the first source terminal and the first drain terminal are made from a material that is different from a material with which the second source terminal and the second drain terminal are made. For example, the first source terminal and the first drain terminal are Ti based n-type ohmic contacts, and the second source terminal and the second drain terminal are Ni based p-type ohmic contacts. In another example, the first source terminal and the first drain terminal are Gold (Au) based n-type ohmic contacts, and second source terminal and the second drain terminal are Au based p-type ohmic contacts.

Alternatively, in some embodiments, instead of the two source terminals and two drain terminals, the semiconductor device may include only one source terminal and one drain terminal, which makes a design of the semiconductor device simpler and cost-effective.

Accordingly, one embodiment discloses a semiconductor device comprising a plurality of epitaxial layers including a barrier layer and a channel layer such that two-dimensional carrier densities are formed at an interface of the barrier layer and the channel layer, wherein a priority of charge carriers of the channel layer is based on a polarization direction of the barrier layer, and wherein the polarization direction of the barrier layer is changed by applying an electric field across the barrier layer. The semiconductor device further comprises a first source terminal and a second source terminal, wherein in one of the first source terminal and the second source terminal is ohmic to electrons and other one is ohmic to holes; a first drain terminal and a second drain terminal, wherein in one of the first drain terminal and the second drain terminal is ohmic to the electrons and other one is ohmic to the holes; a gate terminal arranged on the barrier layer; and a set terminal ohmic to the channel layer.

Accordingly, another embodiment discloses a semiconductor device comprising a plurality of epitaxial layers including a barrier layer and a channel layer such that two-dimensional carrier densities are formed at an interface of the barrier layer and the channel layer, wherein a priority of charge carriers of the channel layer is based on a polarization direction of the barrier layer, and wherein the polarization direction of the barrier layer is changed by applying an electric field across the barrier layer. The semiconductor device further comprises a source terminal; a drain terminal; a gate terminal arranged on the barrier layer; and a set terminal ohmic to the channel layer.

The presently disclosed embodiments will be further explained with reference to the attached drawings. The drawings shown are not necessarily to scale, with emphasis instead generally being placed upon illustrating the principles of the presently disclosed embodiments.

DETAILED DESCRIPTION

In the following description, for purposes of explanation, numerous specific details are set forth in order to provide a thorough understanding of the present disclosure. It will be apparent, however, to one skilled in the art that the present disclosure may be practiced without these specific details. In other instances, apparatuses and methods are shown in block diagram form only in order to avoid obscuring the present disclosure.

As used in this specification and claims, the terms "for example," "for instance," and "such as," and the verbs "comprising," "having," "including," and their other verb forms, when used in conjunction with a listing of one or more components or other items, are each to be construed as open ended, meaning that that the listing is not to be considered as excluding other, additional components or items. The term "based on" means at least partially based on. Further, it is to be understood that the phraseology and terminology employed herein are for the purpose of the description and should not be regarded as limiting. Any heading utilized within this description is for convenience only and has no legal or limiting effect.

Figure 1:
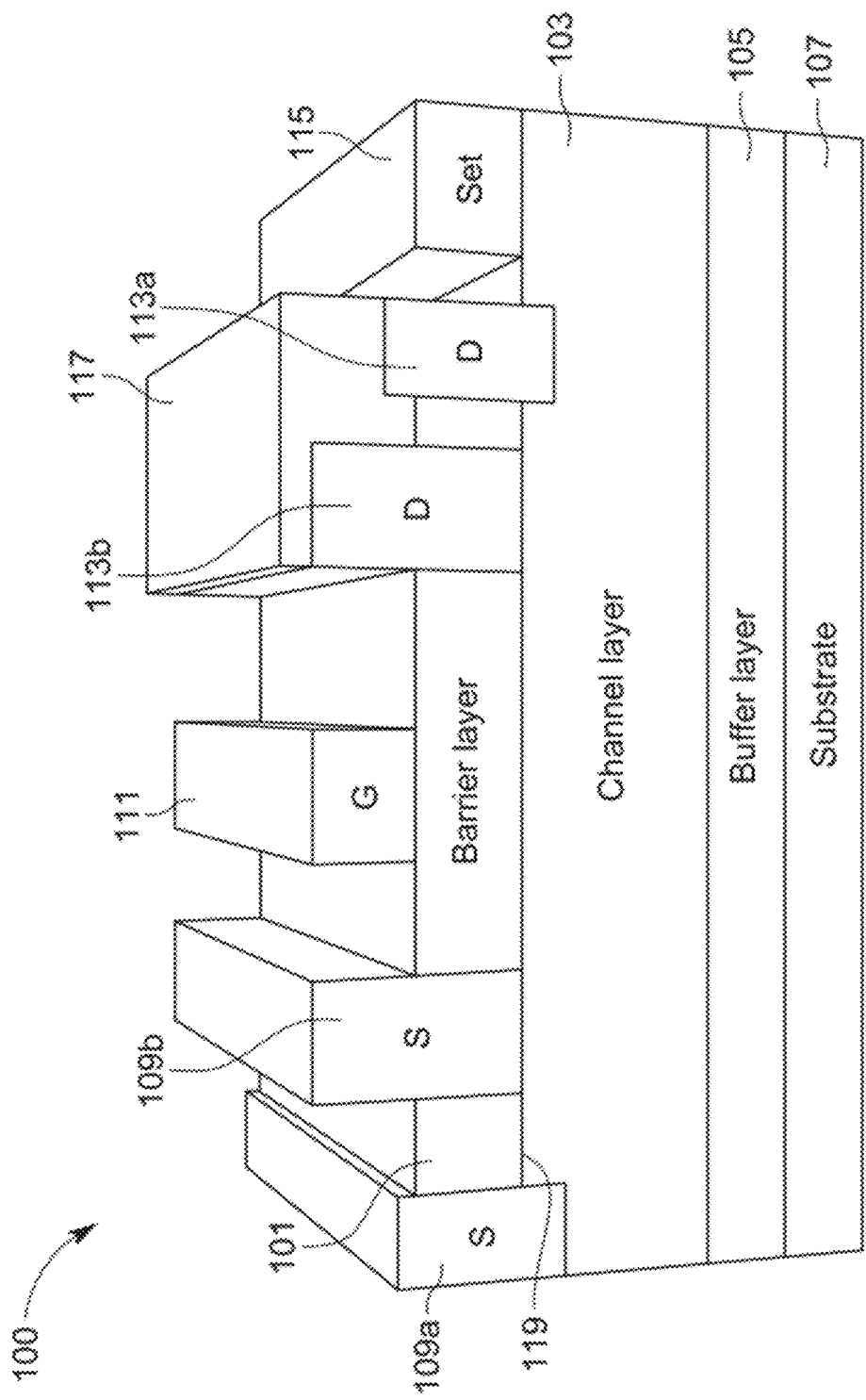
FIG. 1 shows a schematic of a semiconductor device, according to some embodiments of the present disclosure.

FIG. 1 shows a schematic of a semiconductor device 100, according to some embodiments of the present disclosure. The semiconductor device 100 includes epitaxial layers including a barrier layer 101 and a channel layer 103 such that two-dimensional carrier densities are formed at an interface 119 of the barrier layer 101 and the channel layer 103. Further, the semiconductor device 100 includes a buffer layer 105 and a substrate 107. The semiconductor device 100 includes a plurality of terminals, for example, a first source terminal 109a, a second source terminal 109b, a gate terminal 111, a first drain terminal 113a, a second drain terminal 113b, and a set terminal 115. The semiconductor device 100 further includes an insulating layer (not shown in figure) between the gate terminal 111 and the barrier layer 101.

In some implementations, one of the first source terminal 109a and the second source terminal 109b is ohmic to electrons and other one is ohmic to holes. Further, one of the first drain terminal 113a and the second drain terminal 113b is ohmic to the electrons and other one is ohmic to the holes. For example, in an embodiment, the first source terminal 109a is ohmic to the electrons and the second source terminal 109b is ohmic to the holes., and the first drain terminal 113a is ohmic to the electrons and the second drain terminal 113b is ohmic to the holes. The first drain terminal 113a and the second drain terminal 113b are interconnected by an interconnect 117 to form a single output terminal. The gate terminal 111 is arranged on the barrier layer 101. The set terminal 115 is ohmic to the channel layer 103.

Some embodiments are based on the recognition that, to work the semiconductor device 100 as a p-channel Field-Effect Transistor (also referred to as p-FET), the channel layer 103 should include the holes as majority charge carriers, and, to work the semiconductor device 100 as a n-channel Field-Effect Transistor (also referred to as n-FET), the channel layer 103 should include the electrons as the majority charge carriers. To that end, whether the semiconductor device 100 acts as p-FET or n-FET depends on the majority charge carriers in the channel layer 103.

Some embodiments are based on the realization that a priority of charge carriers (i.e., majority charge carriers either holes or electrons) of the channel layer 103 depends on a polarization direction of the barrier layer 101. According to an embodiment, the barrier layer 101 is a III-Nitride compound layer, e.g., Scandium-doped Aluminum Nitride (ScAlN) layer. The barrier layer 101 may be also to be referred to as 'barrier'. The ScAlN material has ferroelectricity characteristic. Ferroelectricity is a characteristic of materials that have a spontaneous electric polarization that can be reversed by application of an external electric field. All ferroelectrics are pyroelectric, with an additional property that their natural electrical polarization is reversible. To that end, the polarization direction of the barrier layer 101, which is the ScAlN layer, can be changed by application of an electric field across the barrier layer 101.

Since the majority charge carriers of the channel layer 103 depends on the polarization direction of the barrier layer 101, and the polarization direction of the barrier layer 101 can be changed by the electric field applied across the barrier layer 101, the electric field can be applied across the barrier layer 101 to switch the polarization direction of the barrier layer 101 such that the semiconductor device 100 can be used as both n-FET and p-FET.

For example, a first voltage can be applied between the gate terminal 111 and the set terminal 115 to form a 2-dimensional electron gas (2-DEG) at the interface 119 of the barrier layer 101 and the channel layer 103. When there is 2-DEG at the interface 119 of the barrier layer 101 and the channel layer 103, the semiconductor device 100 acts as n-FET. Similarly, a second voltage can be applied between the gate terminal 111 and the set terminal 115 to form a 2-dimensional hole gas (2-DHG) at the interface 119 of the barrier layer 101 and the channel layer 103. When there is 2-DHG at the interface 119 of the barrier layer 101 and the channel layer 103, the semiconductor device 100 acts as p-FET. The second voltage is different from the first voltage. For instance, the first voltage applied between the gate terminal 111 and the set terminal 115 may correspond to a positive bias voltage, and the second voltage applied between the gate terminal 111 and the set terminal 115 may correspond to a negative bias voltage.

Figure 2A:
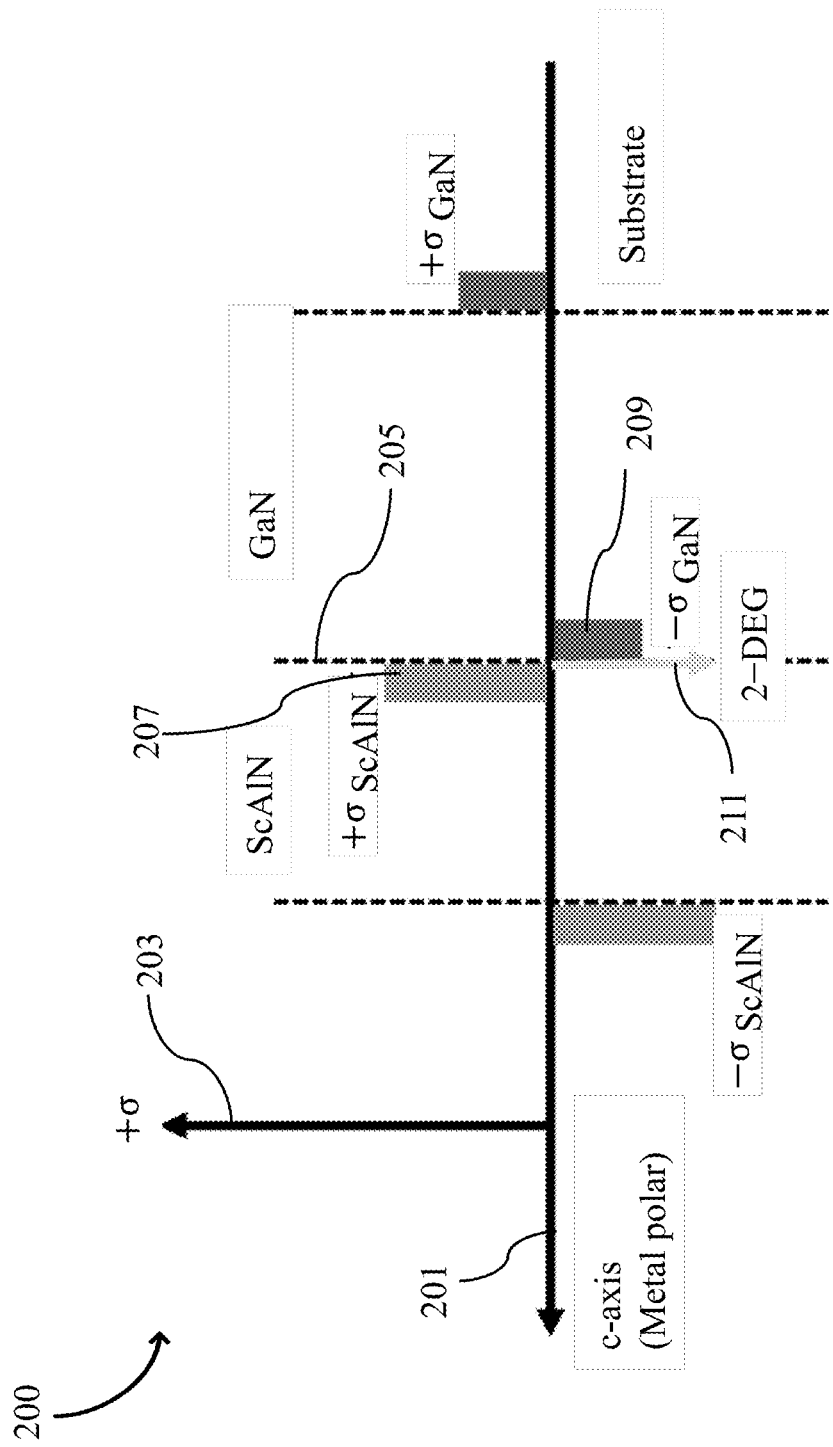
FIG. 2A shows a charge balance diagram when the semiconductor device acts as a n-channel Field-Effect Transistor (n-FET), according to some embodiments of the present disclosure.

FIG. 2A shows a charge balance diagram 200 when the semiconductor device 100 acts as n-FET, according to some embodiments of the present disclosure. The charge balance diagram 200 is a plot of c-axis (metal polar) 201 v/s charge density 203. It may be observed from the charge balance diagram 200 that at an interface 205 (that represents the interface 119) of the barrier layer 101 and the channel layer 103, a charge density 207 of the barrier layer 101 is positive and a charge density 209 of the channel layer 103 is negative. Therefore, 2-DEG 211 exists at the interface 205 of the barrier layer 101 and the channel layer 103, and the semiconductor device 100 acts as n-FET.

Figure 2B:
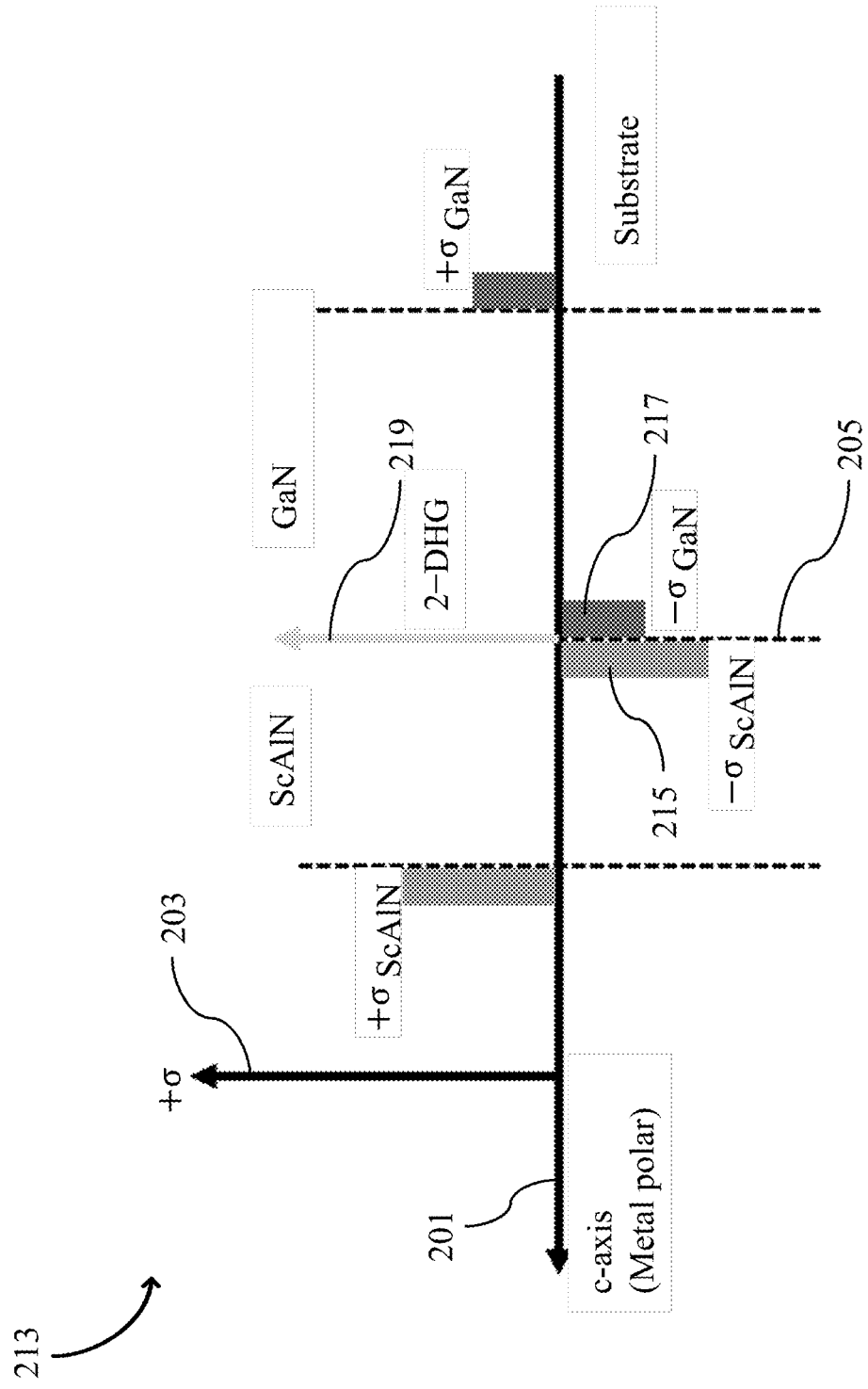
FIG. 2B shows a charge balance diagram when the semiconductor device acts as a p-channel Field-Effect Transistor (p-FET), according to some embodiments of the present disclosure.

FIG. 2B shows a charge balance diagram 213 when the semiconductor device 100 acts as p-FET, according to some embodiments of the present disclosure. It may be observed from the charge balance diagram 213 that at the interface 205 of the barrier layer 101 and the channel layer 103, a charge density 215 of the barrier layer 101 is negative and a charge density 217 of the channel layer 103 is negative. Therefore, 2-DHG 219 exists at the interface 205 of the barrier layer 101 and the channel layer 103, and the semiconductor device 100 acts as p-FET.

In such a manner, the semiconductor device 100 can act as both n-FET and p-FET.

In an embodiment, the channel layer 103 of the semiconductor device 100 is a Gallium Nitride (GaN) layer. Specifically, the channel layer 103 corresponds to an unintentionally doped GaN layer. GaN is a binary III/V direct bandgap semiconductor and is a hard material that has a Wurtzite crystal structure. In an embodiment, the epitaxial layers (i.e., the barrier layer 101 and the channel layer 103) are grown on the substrate 107 by deposition methods. Examples of the substrate 107 include a Sapphire substrate, a GaN substrate, a silicon substrate, and a Silicon Carbide (SiC) substrate. The deposition methods may, for example, include Molecular beam epitaxy (MBE). MBE is an epitaxial process by which growth of materials takes place under Ultra-High Vacuum (UHV) conditions on a heated crystalline substrate by an interaction of adsorbed species supplied by atomic or molecular beams. MBE provides several capabilities favorable for the growth of high-purity, epitaxial thin-film metals. For instance, the UHV conditions result in the highest achievable purity of the grown films. Further, the gate terminal 111 is made of a metal, such as, Titanium (Ti), Aluminum (Al), Nickel (Ni), Molybdenum (Mo), Tungsten (W), or Platinum (Pt).

In some embodiments, a material of the first source terminal 109a and the first drain terminal 113a is different from a material of the second source terminal 109b and the second drain terminal 113b. In other words, the first source terminal 109a and the first drain terminal 113a are made from a material that is different from a material with which the second source terminal 109b and the second drain terminal 113b are made. For example, the first source terminal 109a and the first drain terminal 113a are Ti based n-type ohmic contacts, and the second source terminal 109b and the second drain terminal 113b are Ni based p-type ohmic contacts. In another example, the first source terminal 109a and the first drain terminal 113a are Gold (Au) based n-type ohmic contacts, and the second source terminal 109b and the second drain terminal 113b are Au based p-type ohmic contacts.

Alternatively, in some embodiments, instead of the two source terminals and two drain terminals (as shown in FIG. 1), the semiconductor device 100 may include only one source terminal and one drain terminal, which makes a design of the semiconductor device 100 simpler and cost-effective. Such a semiconductor device is described below in FIG. 3.

Figure 3:
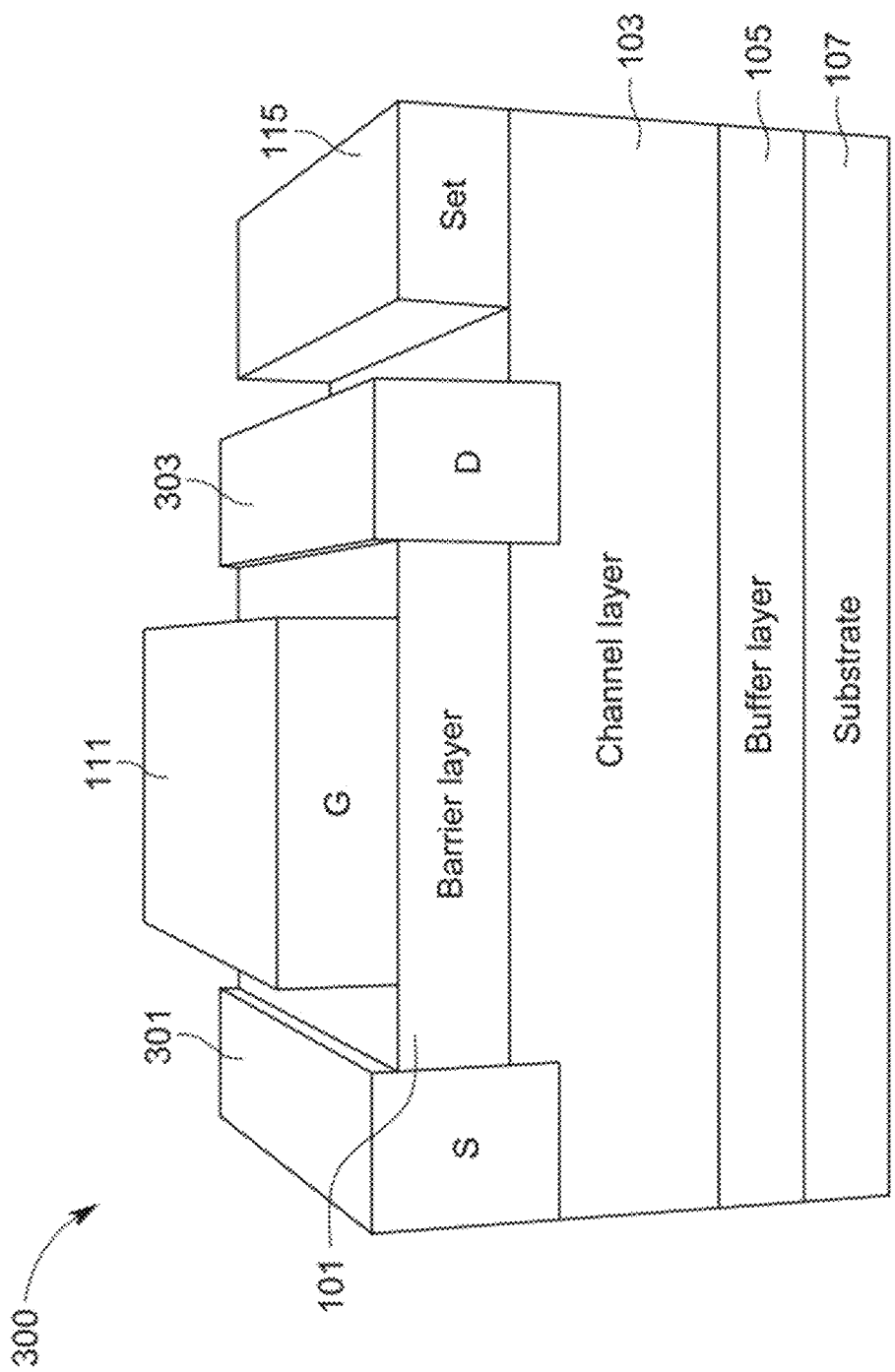
FIG. 3 shows a schematic of a semiconductor device including one source terminal and one drain terminal, according to some embodiments of the present disclosure.

FIG. 3 shows a schematic of a semiconductor device 300, according to some embodiments of the present disclosure. The semiconductor device 300 includes the barrier layer 101, the channel layer 103, the buffer layer 105, and the substrate 107. Further, the semiconductor device 100 includes a plurality of terminals, for example, a source terminal 301, a drain terminal 303, the gate terminal 111, and the set terminal 115. The source terminal 301 and the drain terminal 303 are arranged on the channel layer 103. The source terminal 301 and the drain terminal 303 are of same material. For example, the source terminal 301 and the drain terminal 303 are Ni based p-type ohmic contacts. As the barrier layer 101 of the semiconductor device 300 (and the semiconductor device 100) is made of the III-Nitride material, the semiconductor device 300 (also the semiconductor device 100) may be referred to as III-Nitride semiconductor device.

Since the ferroelectricity characteristic of ScAlN (i.e., the barrier layer 101) enables the semiconductor device 100 (or the semiconductor device 300) to act as both n-FET and p-FET, it is imperative to model different material-based parameters of ScAlN such as a lattice parameter, a strain parameter, piezoelectric polarization, spontaneous polarization, and the like. The different material-based parameters of ScAlN are described below.

Lattice Parameter and Strain Calculations:

Lattice parameters $a_{MeAln}(x)$ and $c_{MeAln}(x)$ (here Me=Scandium (Sc), Gallium (Ga), Indium (In)) of wurtzite crystals according to Vegard's law:

$$a_{GaAlN}(x) = 3.1095 + 0.0891x,$$

$$a_{InAlN}(x) = 3.1095 + 0.4753x,$$

$$c_{GaAlN}(x) = 4.9939 + 0.2323x,$$

$$c_{InAlN}(x) = 4.9939 + 0.8063x,$$

To describe predicted and experimentally observed non-linearities of structural properties, quadratic equations of form bowing parameter are chosen:

$$Y_{ScAlN}(x) = Y_{ScN}x + Y_{AlN}(1-x) + bx(1-x) \text{ where}$$
$$b = 4Y_{ScAlN}(x=0.5) - 2(Y_{ScN} + Y_{AlN})$$

Theoretical approach as well as experimental measurements for wurtzite $Sc_xAl_{(1-x)}N$ are restricted to Sc concentrations $0 \leq x \leq 0.5$, because of phase transition to a cubic structure expected at about $x = 0.45 \pm 0.05$.

Further, nonlinear dependence of lattice constants can be described by:

$$a_{ScAlN}(x) = 3.741x + 3.110(1-x) - 0.242x(1-x),$$

$$c_{ScAlN}(x) = 4.245x + 4.994(1-x) + 1.114x(1-x)$$

For pseudomorphic heterostructures, a resulting biaxial strain is isotropic in a basal plane of a barrier ($\varepsilon_1 = \varepsilon_2$) and causes stresses $\sigma_1 = \sigma_2$, whereas a stress along an [0001]-axis $\sigma_3$ has to be zero. Biaxial strain of the barriers is determined by $$\varepsilon_1^{MeAlN} = \frac{a^{buffer} - a^{MeAlN}(x)}{a^{MeAlN}(x)} \text{ where Me = Sc, Ga, In}$$

Figure 4:
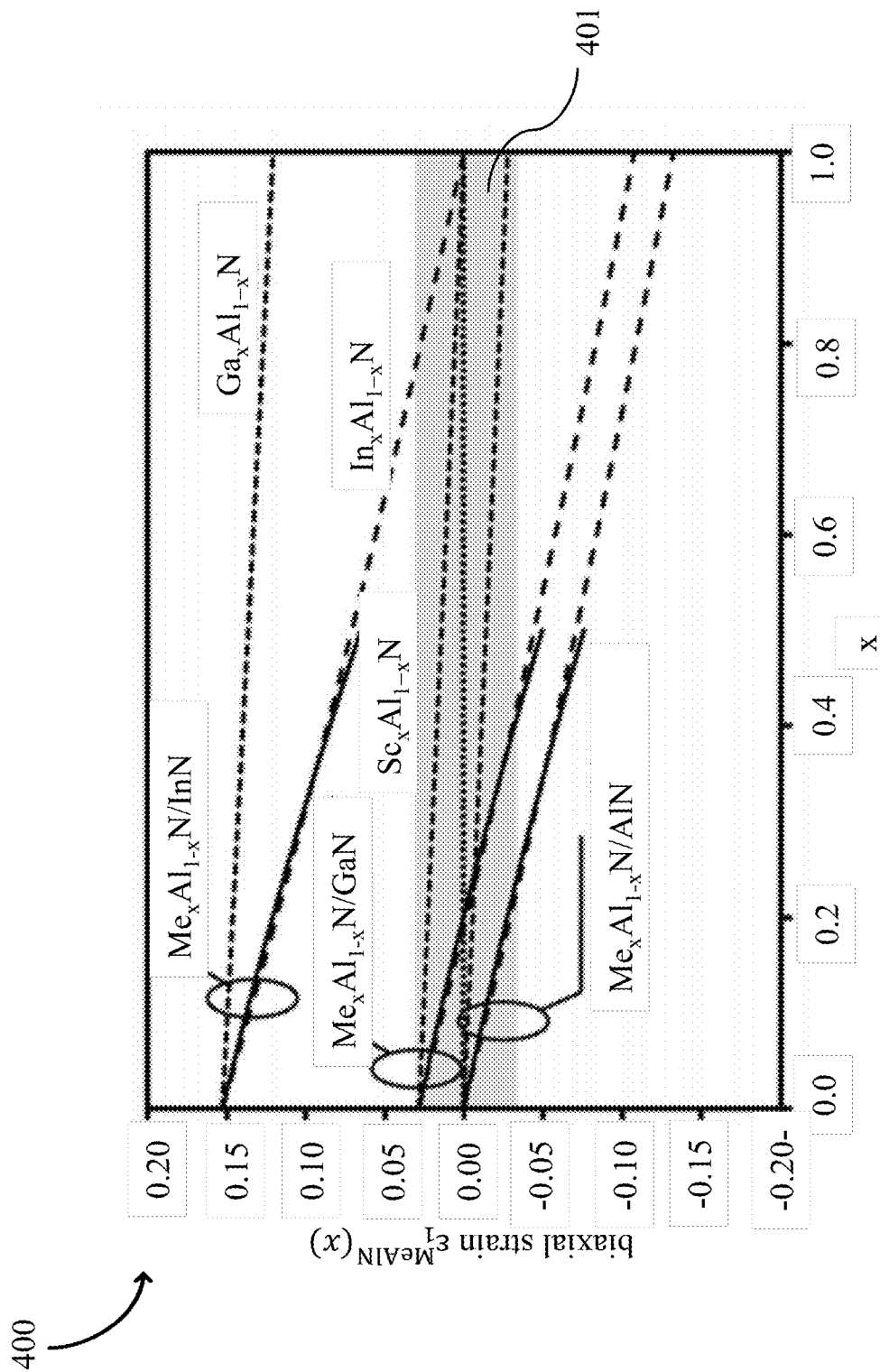
FIG. 4 shows a schematic illustrating biaxial strain of $Sc_xAl_{(1-x)}N$, $Ga_xAl_{(1-x)}N$, and $In_xAl_{(1-x)}N$ barriers that are grown pseudomorphically on relaxed Indium Nitride (InN), Gallium Nitride (GaN), and Aluminium Nitride (AlN) buffer layer, according to some embodiments of the present disclosure.

FIG. 4 shows a schematic 400 illustrating the biaxial strain $\varepsilon_1^{MeAlN}(x)$ of $Sc_xAl_{(1-x)}N$, $Ga_xAl_{(1-x)}N$, and $In_xAl_{(1-x)}N$ barriers that are grown pseudomorphically on relaxed Indium Nitride (InN), GaN, and Aluminium Nitride (AlN) buffer layer, according to some embodiments of the present disclosure. A gray shaded region 401 indicates an interval of the biaxial strain $-0.03 \leq \varepsilon_1^{MeAlN}(x) \leq 0.03$, which is relevant for processing robust electronic devices based on pseudomorphic MeAlN/buffer heterostructures. Further, from FIG. 4 it may be observed that, $Me_xAl_{(1-x)}N/InN, 0 \leq x \leq 1$: $\varepsilon_1^{MeAlN}(x) \leq 0$, $Me_xAl_{(1-x)}N/AlN, 0 \leq x \leq 1$: $\varepsilon_1^{MeAlN}(x) \leq 0$, $Ga_xAl_{(1-x)}N/GaN, 0 \leq x \leq 1$: $\varepsilon_1^{GaAlN}(x) \geq 0$, $In_xAl_{(1-x)}N/GaN, 0 \leq x \leq 0.18$: $\varepsilon_1^{InAlN}(x) \geq 0$ $0.18 \leq x \leq 1$: $\varepsilon_1^{MeAlN}(x) \leq 0$, $Sc_xAl_{(1-x)}N/GaN, 0 \leq x \leq 0.2$: $\varepsilon_1^{ScAlN}(x) \geq 0$ and $0.2 \leq x \leq 0.5$: $\varepsilon_1^{ScAlN}(x) \leq 0$ For $\varepsilon_1^{MeAlN}(x) \geq 0$, the barriers are under biaxial tensile strain, and a vector of the piezoelectric polarization is pointing from heterostructure surface toward its interface, if the wurtzite crystals are metal polar. For $\varepsilon_1^{MeAlN}(x) \leq 0$, the barriers are under biaxial compressive strain, and the piezoelectric polarization vector is pointing toward the heterostructure surface. If a polarity of the wurtzite crystals is N-face instead of Me-face, a sign and orientation of the piezoelectric (and spontaneous) polarization vector are inverted.

Piezoelectric Polarization:

According to an embodiment, the piezoelectric polarization as a function of strain for hexagonal materials belonging to $C_{6v}$ crystallographic point group is given by:

$$P_{PE,k} = \sum_l e_{kl} \varepsilon_l, \text{ where } k = 1, 2, 3, l = 1, \ldots, 6.$$

A non-vanishing component of the piezoelectric polarization oriented along the [0001]-axis caused by the biaxial strain in the basal plane is $$P_{PE,3} = \varepsilon_1 e_{31} + \varepsilon_2 e_{32} + \varepsilon_3 e_{33}, = 2\varepsilon_1 e_{31} + \varepsilon_3 e_{33},$$

where $\varepsilon 1 = \varepsilon 2$,
where $$\varepsilon_3 = -2 \frac{C_{13}}{C_{33}} \varepsilon_1,$$

where $C_{13}$ and $C_{33}$ are elastic constants for crystals with the wurtzite structure.

$$= 2\varepsilon_1(\varepsilon_{31} - \varepsilon_{33}\frac{C_{13}}{C_{33}})$$

where $$\varepsilon_1(x) = \varepsilon_1^{barrier}(x) = \frac{a^{buffer} - a^{barrier}(x)}{a^{barrier}(x)}$$

Some embodiments are based on recognition that besides the fact that the piezoelectric polarization along the c-axis is linearly dependent on a relative change of the lattice constant $a_{barrier}$, $P_{PE(biaxial),3}$ is always negative for the barriers under biaxial tensile strain ($\varepsilon_1^{barrier}(x) \geq 0$) and positive for crystals under the biaxial compressive strain ($\varepsilon_1^{barrier}(x) \leq 0$).

A Density-Functional Theory (DFT) simulation yielded values for lattice parameter known as elastic coefficients (given in GPa) to observe a nonlinear behavior of lattice parameter of $Sc_xAl_{(1-x)}N$ and a linear behavior of lattice parameter of $Ga_xAl_{(1-x)}N$ and $In_xAl_{(1-x)}N$ described in the following equations:

$$C_{13}^{ScAlN}(x) = 141.70x + 108.00(1-x) + 51.95x(1-x)$$

$$C_{33}^{ScAlN}(x) = 155.17x + 373.00(1-x) + 95.49x(1-x)$$

$$C_{13}^{GaAlN}(x) = -5x + 108$$

$$C_{33}^{GaAlN}(x) = 32x + 373,$$

$$C_{13}^{InAlN}(x) = -16x + 108,$$

$$C_{13}^{InAlN}(x) = -149x + 373$$

The DFT-simulation also resulted values for tensor components known as piezoelectric coefficients (given in C/m$^2$) to observe the nonlinear behavior of lattice parameter of $Sc_xAl_{(1-x)}N$ and the linear behavior of lattice parameter of $Ga_xAl_{(1-x)}N$ and $In_xAl_{(1-x)}N$ described in the following equations:

$$e_{13}^{ScAlN}(x) = -1.353x - 0.593(1-x) - 0.576x(1-x)$$

$$e_{33}^{ScAlN}(x) = 9.125x + 1.471(1-x) - 6.625x(1-x)$$

$$e_{13}^{GaAlN}(x) = 0.253x - 0.593,$$

$$e_{33}^{GaAlN}(x) = 0.801x + 1.471,$$

$$e_{13}^{InAlN}(x) = -0.183x - 0.593,$$

$$e_{33}^{InAlN}(x) = -0.661x + 1.471.$$

Figure 5:
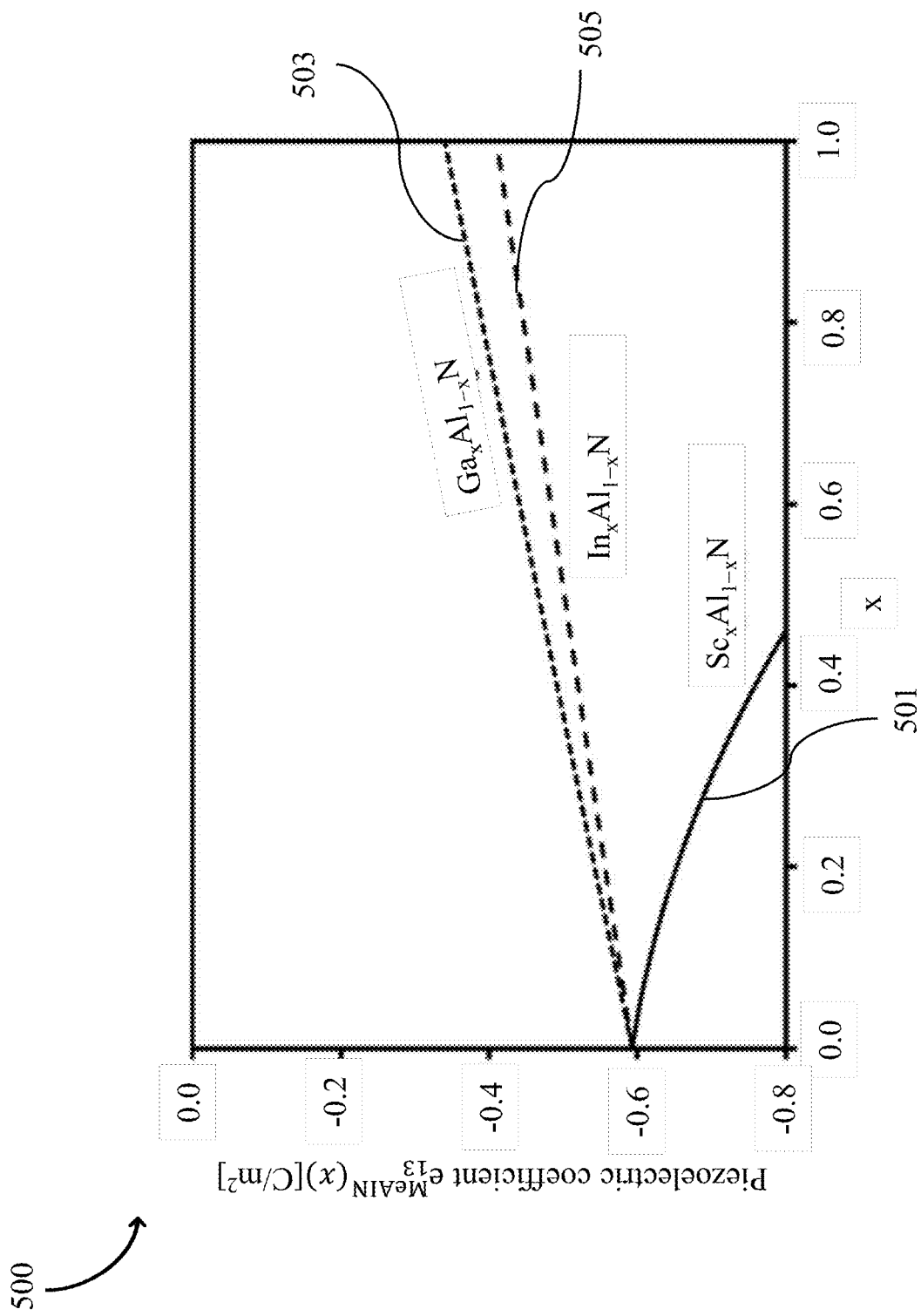
FIG. 5 shows a plot of piezoelectric coefficient $e_{13}^{MeAlN}(x)$ vs Scandium (Sc) atom content, according to an embodiment of the present disclosure.

FIG. 5 shows a plot 500 of the piezoelectric coefficient $e_{13}^{MeAlN}(x)$ vs Sc-atom content, according to an embodiment of the present disclosure. A line 501 represents the piezoelectric coefficient $e_{13}^{MeAlN}(x)$ for $Sc_xAl_{(1-x)}N$ alloys with the wurtzite crystal structure over Sc-atom content ($0 \leq x \leq 0.5$). Lines 503 and 505 represent the piezoelectric coefficient $e_{13}^{MeAlN}(x)$ for $Ga_xAl_{(1-x)}N$ and $In_xAl_{(1-x)}N$, respectively, over a whole range of possible compositions ($0 \leq x \leq 1$).

Figure 6:
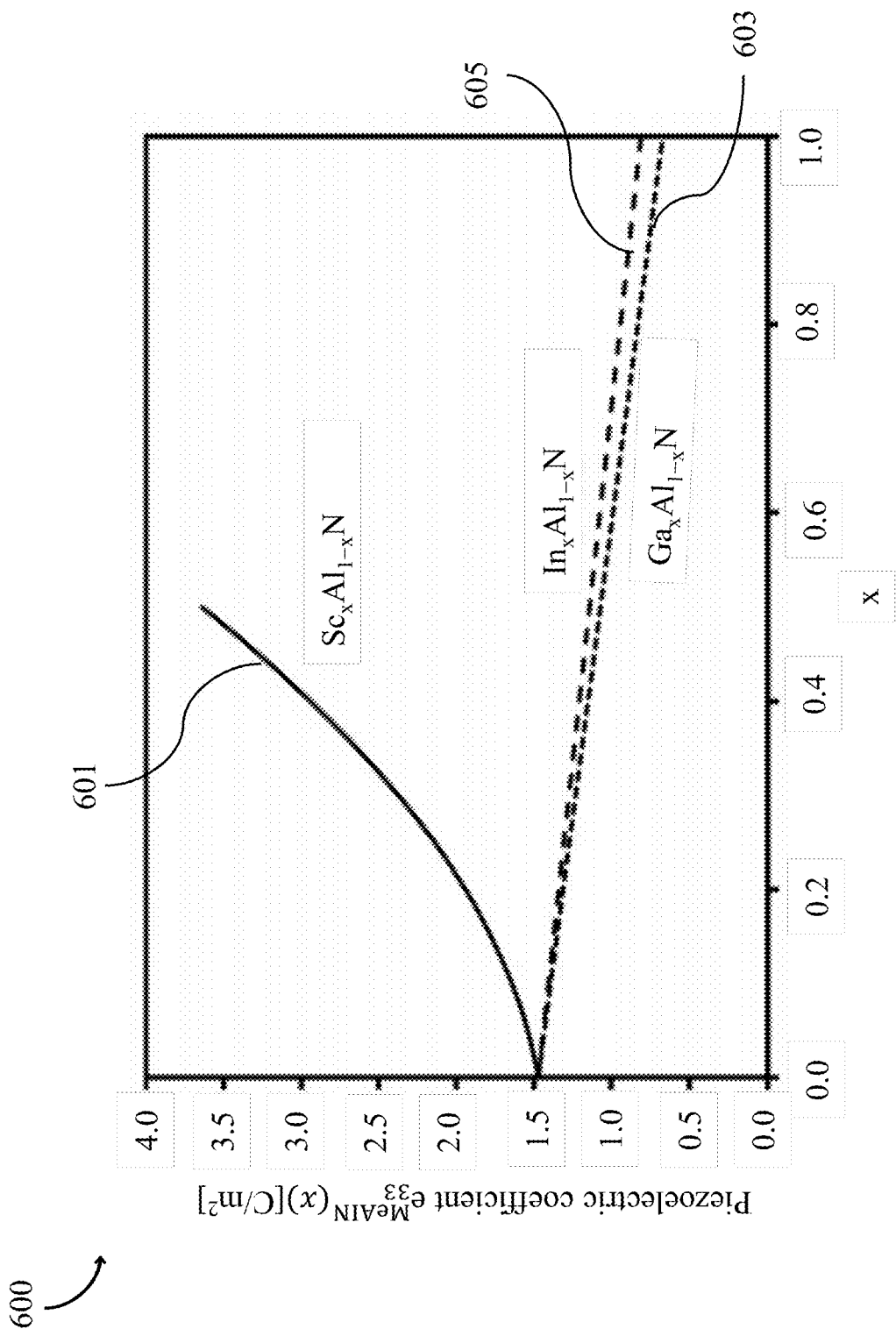
FIG. 6 shows a plot of piezoelectric coefficient $e_{33}^{MeAlN}(x)$ vs Sc-atom content, according to an embodiment of the present disclosure.

FIG. 6 shows a plot 600 of the piezoelectric coefficient $e_{33}^{MeAlN}(x)$ vs the Sc-atom content, according to an embodiment of the present disclosure. A line 601 represents the piezoelectric coefficient $e_{33}^{MeAlN}(x)$ for $Sc_xAl_{(1-x)}N$ alloys with the wurtzite crystal structure over Sc-atom content ($0 \leq x \leq 0.5$). Lines 603 and 605 represent the piezoelectric coefficient $e_{33}^{MeAlN}(x)$ for $Ga_xAl_{(1-x)}N$ and $In_xAl_{(1-x)}N$, respectively, over the whole range of possible compositions ($0 \leq x \leq 1$).

From FIG. 5 and FIG. 6, it may be observed that values of the piezoelectric coefficients $|e_{13}^{MeAlN}(x)|$ and $|e_{33}^{MeAlN}(x)|$ are increased in a nonlinear way, if a number of Al-atoms of AlN substituted by Sc-atoms is enlarged. Further, because of opposite signs of the piezoelectric coefficients ($e_{13}^{MeAlN}(x) < 0$, $e_{33}^{MeAlN}(x) > 0$) and $$2\varepsilon 1\left(\varepsilon 31 - \varepsilon 33\frac{C_{13}}{C_{33}}\right),$$

a value of the piezoelectric polarization for $Sc_xAl_{(1-x)}N$ is increased, if x is enlarged.

For the same biaxial strain $\varepsilon 1$ and an alloy composition x, the value of piezoelectric polarization of $Sc_xAl_{(1-x)}N$ is larger compared to $In_xAl_{(1-x)}N$ and $Ga_xAl_{(1-x)}N$.

Figure 7:
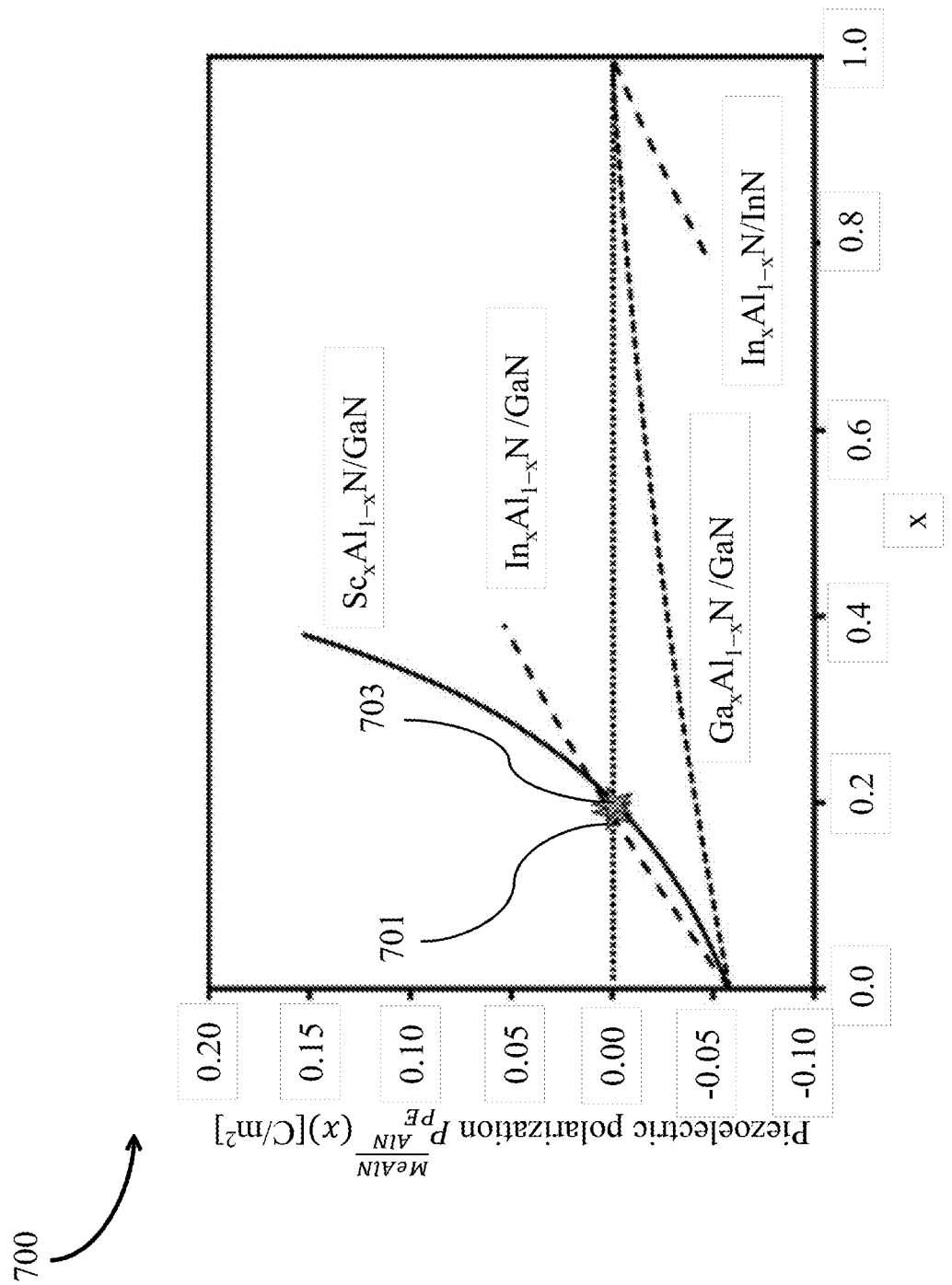
FIG. 7 shows a plot of piezoelectric polarization vs an alloy composition x, according to some embodiments of the present disclosure.

FIG. 7 shows a plot 700 of piezoelectric polarization $$P_{PE}^{AlN}{}^{MeAlN}(x) vs$$

the alloy composition x, according to some embodiments of the present disclosure. Stars 701 and 703 indicate an alloy composition of lattice-matched $In_xAl_{(1-x)}N/GaN$ [x=(0.18±0.01)] and $Sc_xAl_{(1-x)}N/GaN$ [x=(0.20±0.01)] heterostructures, respectively, which are free of piezoelectric polarization.

For heterostructures with the barriers under moderate strain, the below equations can be used as an input as a cause for surface and interface bound sheet charges, depending on an implementation of polarization induced effects, in a self-consistent Schrödinger-Poisson solver based, e.g., on effective mass or tight-binding theory.

$$P_{PE}^{GaN}{}^{GaAlN}(x) = -0.058(1-x) - 0.031x(1-x), 1.00 \geq x \geq 0$$

$$P_{PE}^{GaN}{}^{InAlN}(x) = 0.160x - 0.058(1-x) - 0.011x(1-x), 0.39 \geq x \geq 0$$

$$P_{PE}^{GaN}{}^{ScAlN}(x) =$$
$$3.194x - 0.058(1-x) - 2.986x(1-x) - 3.603x^2(1-x), 0.38 \geq x \geq 0$$

$$P_{PE}^{AlN}{}^{GaAlN}(x) = -0.028(1-x) - 0.029x(1-x), 1.00 \geq x \geq 0$$

$$P_{PE}^{AlN}{}^{InAlN}(x) = 0.187(1-x) - 0.124x(1-x), 0.20 \geq x \geq 0$$

$$P_{PE}^{AlN}{}^{ScAlN}(x) = 1.199x - 0.997x(1-x), 0.21 \geq x \geq 0$$

$$P_{PE}^{InN}{}^{InAlN}(x) = -0.303(1-x) - 0.106x(1-x), 1.00 \geq x \geq 0.78$$

From FIG. 7, it may be observed that the piezoelectric polarization increases if the number of Al-atoms substituted by another metal-atom (Me=Sc, Ga, In) is enlarged, independent of binary buffer layer chosen. For heterostructures grown on the AlN-buffer layer, the piezoelectric polarization of the barrier is always positive (oriented along the [0001]-axis), reaching maximum values of 0.028, 0.057, and 0.089 C/m2 for GaN/AlN, In0.20Al0.80N/AlN and Sc0.21Al0.79N/AlN heterostructures, respectively. Piezoelectric barrier polarizations of InxAl1−xN/GaN and ScxAl1−xN/GaN heterostructures are also positive for x>0.18 and x>0.20, reaching 0.053 and 0.153 C/m2 for x=0.39 and x=0.38, respectively. For 0≤x<0.18 and 0≤x<0.20, barriers of the InxAl1−xN/GaN and ScxAl1−xN/GaN heterostructures as well as those of GaxAl1−xN/GaN heterostructures show negative piezoelectric polarization with the highest value for AlN/GaN of −0.058 C/m2.

The piezoelectric polarization $$P_{PE}^{\frac{barrier}{buffer}}(x)$$

within barriers of the pseudomorphic MeAlN/buffer heterostructures in dependence on the alloy composition is determined by leveraging nonlinear and linear equations of the biaxial strain, the elastic coefficients, and the piezoelectric coefficients in order to examine the piezoelectric polarization of $Sc_xAl_{(1-x)}N$ in comparison to $Ga_xAl_{(1-x)}N$ and $In_xAl_{(1-x)}N$.

Figure 8:
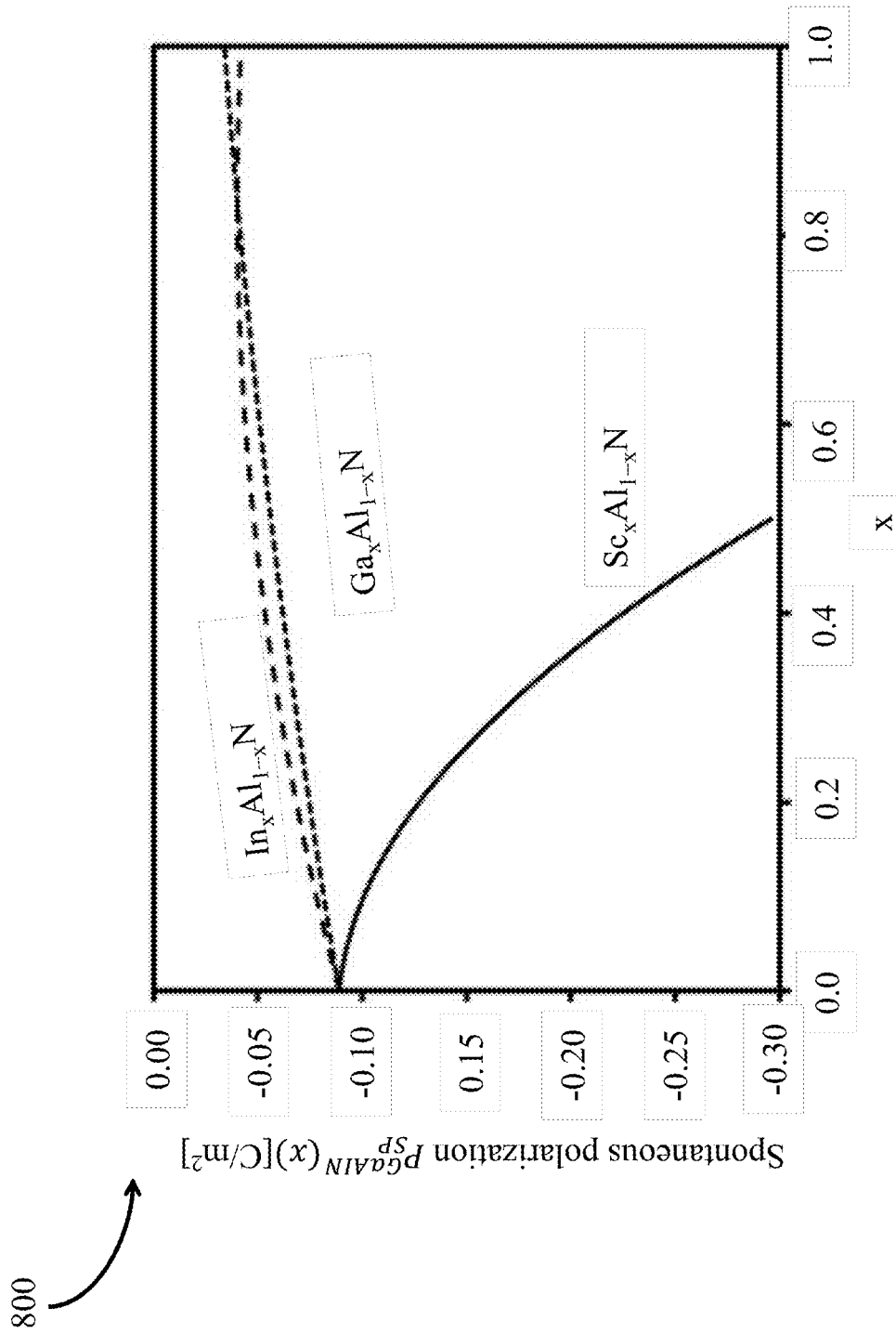
FIG. 8 shows a plot of predicted spontaneous polarization vs a metal atom content x, for metal-polar, random $Me_xAl_{(1-x)}N$ alloys with a wurtzite crystal structure, according to some embodiments of the present disclosure.

Spontaneous and Total Polarization:

FIG. 8 shows a plot 800 of predicted spontaneous polarization $P_{SP}^{GaAlN}(x)$ vs a metal atom content x, for metal-polar, random $Me_xAl_{(1-x)}N$ (Me=Ga, In or Sc) alloys with the wurtzite crystal structure, according to some embodiments of the present disclosure.

Nonlinear spontaneous polarization of the random alloys can be approximated by (in C/m2), $$P_{SP}^{GaAlN}(x) = -0.034x - 0.090(1-x) + 0.019x(1-x),$$

$$P_{SP}^{InAlN}(x) = -0.042x - 0.090(1-x) + 0.071x(1-x)$$

$$P_{SP}^{ScAlN}(x) = -0.874x + 0.089(1-x) + 0.741x(1-x)$$

For metal polar GaAlN, InAlN and ScAlN barriers, and for the buffer layer, the spontaneous polarization is oriented along the direction. A value of the spontaneous polarization decreases, if Al-atoms are replaced by Ga or In, whereas the value of the spontaneous polarization is largely enhanced, if Al is substituted by Sc-atoms.

Figure 9:
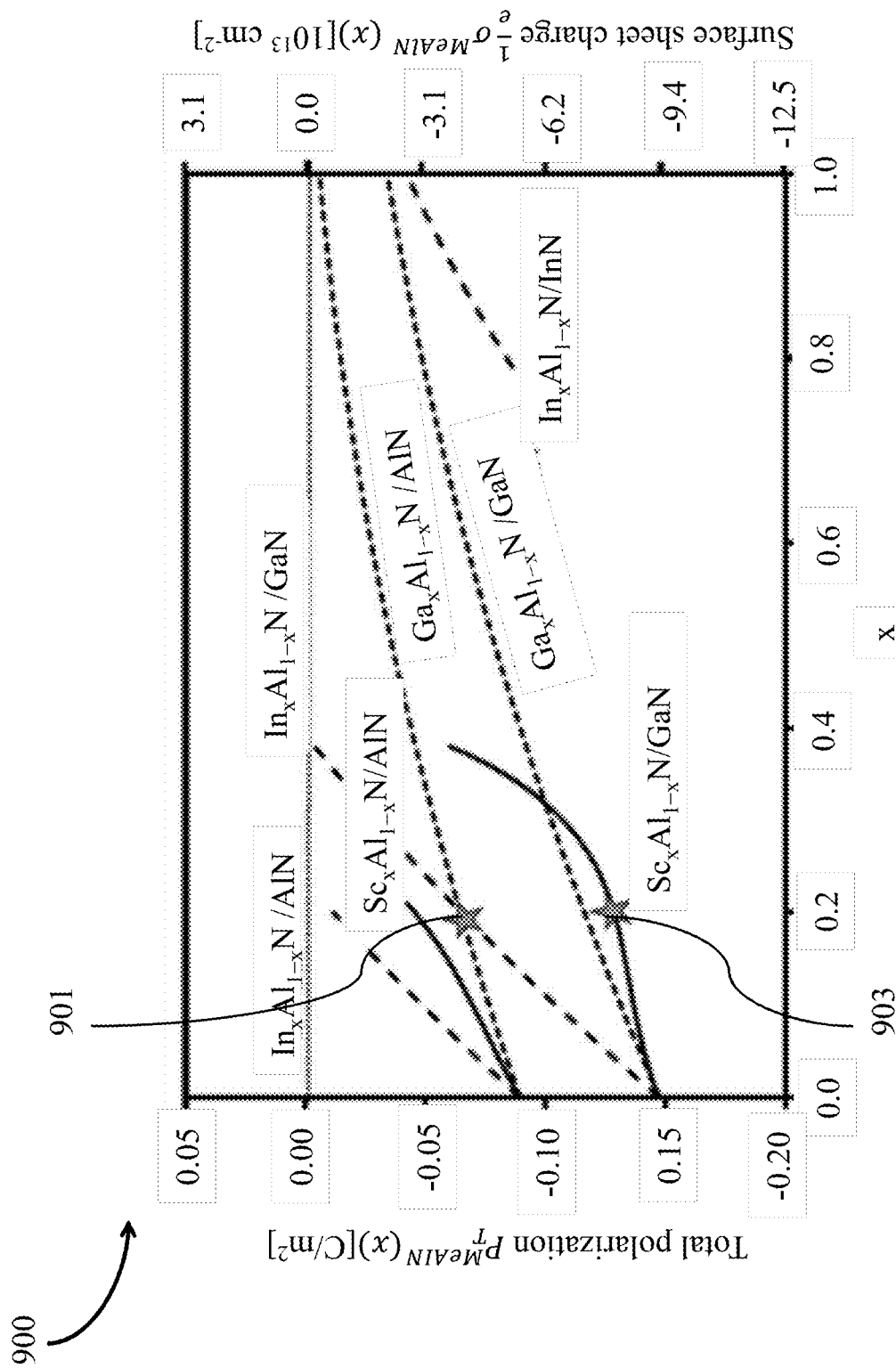
FIG. 9 shows a plot of polarization induced surface charges and a total polarization vs the alloy composition x, for barriers of different materials, according to some embodiments of the present disclosure.

FIG. 9 shows a plot 900 of polarization induced surface charges and a total polarization $P_T^{MeAlN}(x)$ vs the alloy composition x, for barriers of different materials, according to some embodiments of the present disclosure. Stars 901 and 903 indicate the polarization induced surface charges and the total polarization of barriers ($P_T^{MeAlN} = P_{SP}^{MeAlN} < 0$) in lattice-matched InxAl1−xN/GaN [x=(0.18±0.01)] and ScxAl1−xN/GaN [x=(0.20±0.01)] hetero structures, respectively.

The total polarization is a sum of the piezoelectric polarization and the spontaneous polarization:

$$P_T^{MeAlN}(x) = P_{SP}^{MeAlN}(x) + P_{PE}^{\frac{MeAlN}{buffer}}(x)$$

From FIG. 9, it may be observed that a value of the total polarization is decreasing, with increasing number of Al-atoms substituted by Ga-, In-, or Sc-atoms. High total polarizations values above 0.10 C/m² are observed for the barriers of the $Ga_xAl_{1-x}N/GaN$ and $Sc_xAl_{1-x}N/GaN$ heterostructures with 0≤x<0.31 as well as for the $In_xAl_{1-x}N/GaN$ heterostructures with 0≤x<0.11. The barriers of the $Sc_xAl_{1-x}N/GaN$ heterostructures show the highest values of the total polarization in an interval of 0≤x<0.31. The polarization induced surface sheet charges of metal polar barrier layers $$\frac{1}{e}\sigma^{MeAlN}$$

can be determined through a division of the total polarizations $P_T^{MeAlN}$ by an electron charge (e=1.602×10⁻¹⁹ C). For a lattice matched $Sc_{0.20}Al_{0.80}N/GaN$ heterostructure, in which the piezoelectric polarization of the barrier vanishes, the total polarization is as high as 0.128 C/m².

Further, it is observed from FIG. 9 that the polarization induced surface sheet charges of the pseudomorphic heterostructures are always negative. Negative polarization induced surface sheet charges below −6.2×10¹³ cm⁻² are observed for the barriers of the $Ga_xAl_{1-x}N/GaN$ and $Sc_xAl_{1-x}N/GaN$ heterostructures with 0≤x<0.31 as well as for the $In_xAl_{1-x}N/GaN$ heterostructures with 0≤x<0.11. For the lattice-matched $Sc_{0.20}Al_{0.80}N/GaN$ and $In_{0.18}Al_{0.82}N/GaN$ heterostructures, barrier surface sheet charges of −7.99×10¹³ and −4.17×10¹³ cm⁻² are determined, respectively. These sheet charges are equal to about 8 and 4 elementary electron charges per every 100 surface atoms. Positive bound sheet charges at bottom of relaxed InN, GaN, and AlN buffer crystals are induced by a gradient in the spontaneous polarization only and are calculated to be 2.62×10¹³, 2.12×10¹³, and 5.56×10¹³ cm⁻², respectively Sheet Charge Density and Polarization Induced 2-DEG:

A higher bandgap of the barrier in comparison to the buffer layer is an additional criterion for a selection of suitable heterostructures for processing High Electron Mobility Transistors (HEMTs).

$$E_g^{MeAlN} > E_g^{buffer}$$

Penetration of a conduction band edge below Fermi level is determined by an iterative approach, $$\Delta^{\frac{MeAlN}{buffer}}(x) = E_0^{\frac{MeAlN}{buffer}}(x) + \frac{h^2}{4\pi m_{buffer}^*} n_s^{\frac{MeAlN}{buffer}}(x)$$

where a ground sub band level of the 2-DEG is given as $$E_0^{\frac{MeAlN}{buffer}}(x) = \left\{ \frac{9he^2}{16\varepsilon_0 \varepsilon_{33}^{buffer} \sqrt{8m_{buffer}^*}} n_s^{\frac{MeAlN}{buffer}}(x) \right\}^{\frac{2}{3}}$$

where h=4.1357×10⁻¹⁵ eV s is Planck constant and m*$_{buffer}$ is an effective electron mass of the buffer layer (M*$_{GaN}$=0.222 m$_e$, m*$_{InN}$=0.055 m$_e$). ε₀ is a dielectric constant of vacuum, $\varepsilon_{33}^{buffer}$ is a relative dielectric coefficient and $$n_s^{\frac{MeAlN}{buffer}}$$

is a sheet electron concentration.

Figure 10:
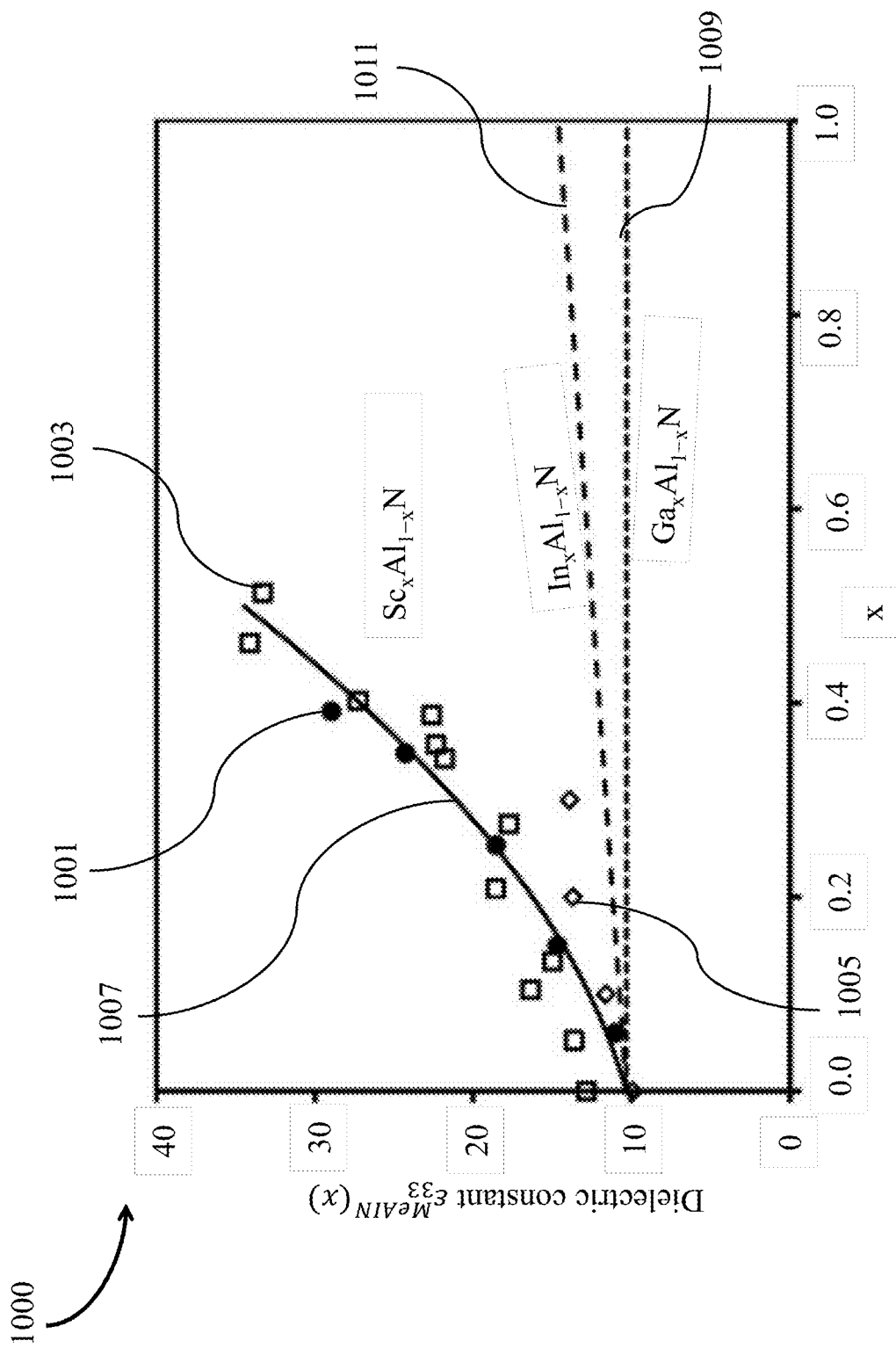
FIG. 10 shows a plot of dielectric constant vs the alloy composition x, according to some embodiments of the present disclosure.

FIG. 10 shows a plot of 1000 of dielectric constant $\varepsilon_{33}^{MeAlN}(x)$ vs the alloy composition x, according to some embodiments of the present disclosure. In the plot 1000, circles 1001, squares 1003, and rhombus 1005 represent measured values of the dielectric constant $\varepsilon_{33}^{MeAlN}(x)$ of $Sc_xAl_{1-x}N$. A line 1007 represents calculated dielectric constant $\varepsilon_{33}^{MeAlN}(x)$ of $Sc_xAl_{1-x}N$. Lines 1009 and 1011 represent the dielectric constant $\varepsilon_{33}^{MeAlN}(x)$ of $Ga_xAl_{(1-x)}N$ and $In_xAl_{(1-x)}N$, respectively.

To describe physical properties of the barriers in dependence of the alloy composition in the intervals of x, the following interpolations are used:
Dielectric Coefficient:

$\varepsilon_{33}^{GaAlN}(x)=-0.03x+10.31$ $\varepsilon_{33}^{InAlN}(x)=4.30x+10.3$ $\varepsilon_{33}^{ScAlN}(x)=89.93x+10.31(1-x)-62.48x(1-x)$ For $\varepsilon_1^{MeAlN}(x) \geq 0$, the barriers are under the biaxial tensile strain, and the vector of the piezoelectric polarization is pointing from the heterostructure surface toward its interface, if the crystals are metal polar. For $\varepsilon_1^{MeAlN}(x) \leq 0$, the barriers are under the biaxial compressive strain, and the piezoelectric polarization vector is pointing toward the heterostructure surface. If the polarity of the wurtzite crystals is N-face instead of Me-face, the sign and orientation of the piezoelectric (and spontaneous) polarization vector are inverted.

Figure 11:
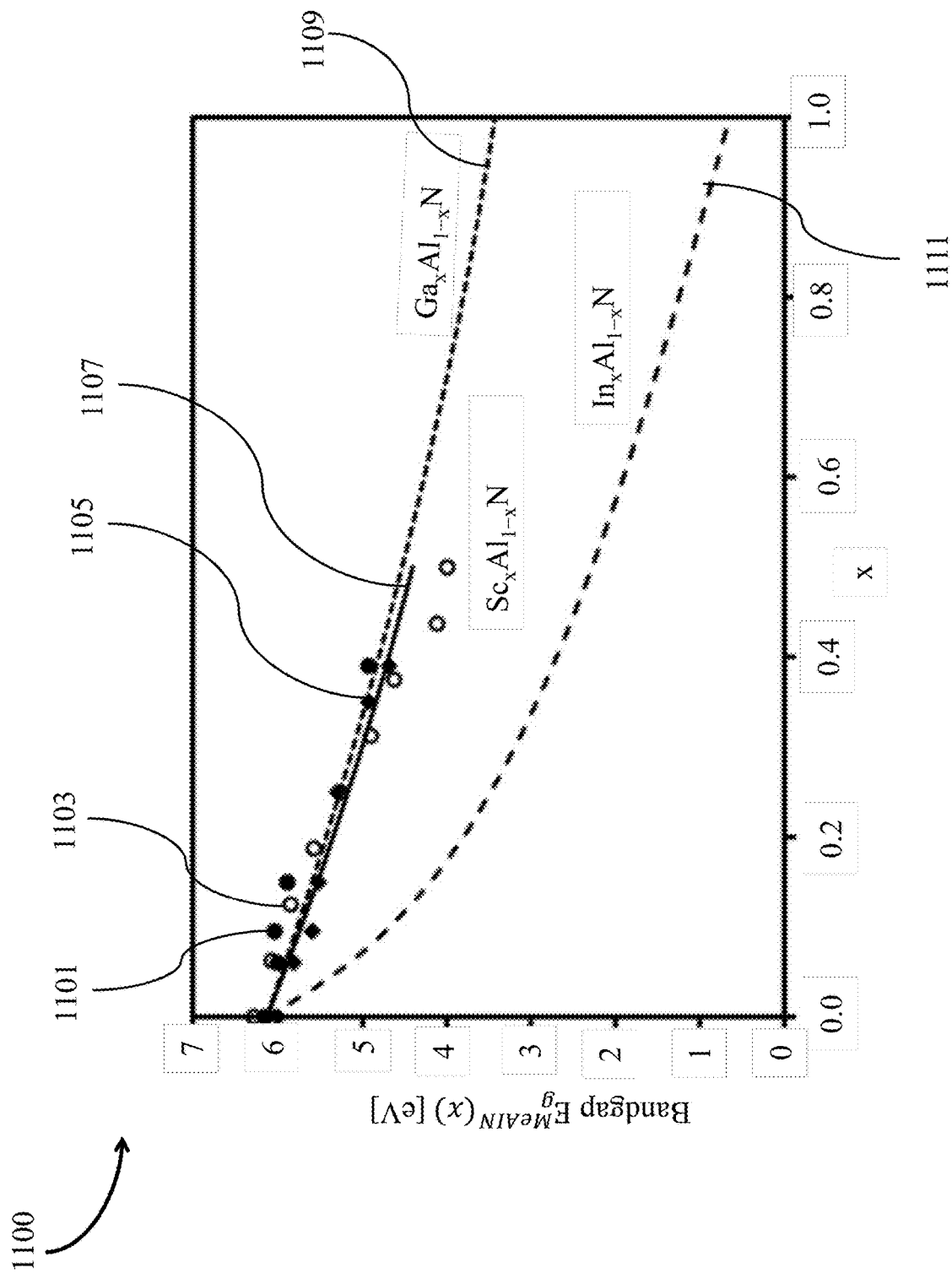
FIG. 11 shows a plot of bandgap vs the alloy composition x, according to some embodiments of the present disclosure.

FIG. 11 shows a plot 1100 of bandgap $E_g^{MeAlN}$ vs the alloy composition x, according to some embodiments of the present disclosure. In the plot 1100, black circles 1101, circles 1103, and rhombus 1105 represent measured values of the bandgap $E_g^{MeAlN}$ of $Sc_xAl_{1-x}N$. A line 1107 represents calculated bandgap $E_g^{MeAlN}$ of $Sc_xAl_{1-x}N$. Lines 1109 and 1111 represent the bandgap $E_g^{MeAlN}$ for $Ga_xAl_{(1-x)}N$ and $In_xAl_{(1-x)}N$, respectively.

Figure 12:
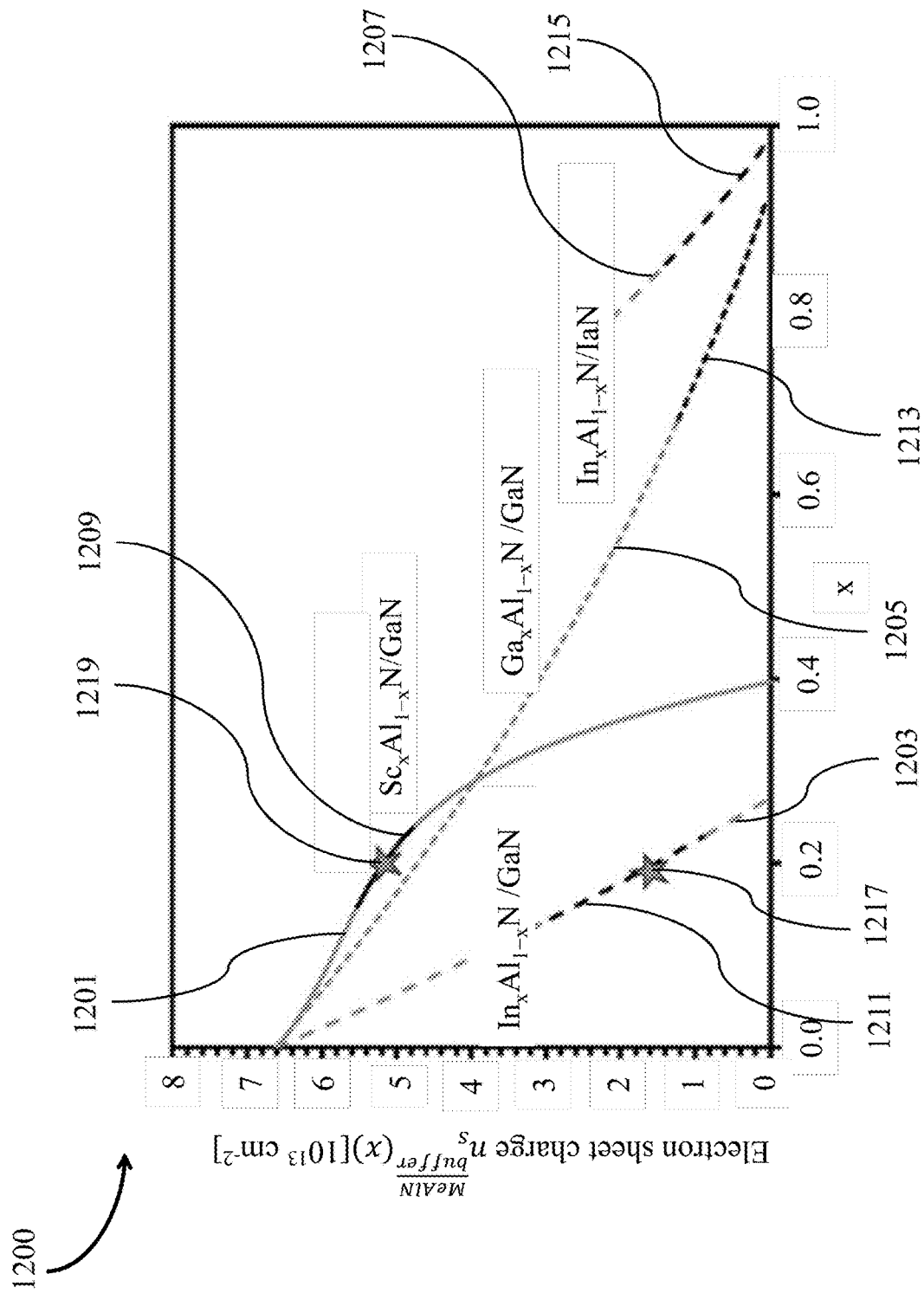
FIG. 12 shows a plot of polarization induced electron sheet charge vs the alloy composition x, according to some embodiments of the present disclosure.

Bandgap equations are given as:

$E_g^{GaAlN}(x)=3.42x+6.13(1-x)-1.0x(1-x)$, for $0 \leq x \leq 1.0$ $E_g^{InAlN}(x)=3.42x+6.13(1-x)-4.5x(1-x)$, for $0 \leq x \leq 1.0$ $E_g^{ScAlN}(x)=3.42x+6.13(1-x)-1.5x(1-x)$, for $0 \leq x \leq 0.5$ FIG. 12 shows a plot 1200 of polarization induced electron sheet charge $n_s^{\frac{MeAlN}{AlN}}(x) vs$ the alloy composition x, according to some embodiments of the present disclosure. A line 1201 represents the polarization induced electron sheet charge of pseudomorphic, metal polar $Ni/Sc_xAl_{1-x}N/GaN$. Lines 1203, 1205, and 1207 represent the polarization induced electron sheet charge of $Ni/In_xAl_{1-x}N/GaN$, $Ni/Ga_xAl_{1-x}N/GaN$ and $Ni/In_xAl_{1-x}N/InN$ heterostructures, respectively. Dark parts 1209, 1211, 1213, and 1215 of the lines 1201-1207 indicate the polarization induced electron sheet charges vs alloy compositions, which can be achieved if limitations set by the maximum strain, a critical barrier thickness and depletion caused by Schottky contact are considered. Stars 1217 and 1219 indicate the polarization induced electron sheet charges of lattice-matched $In_xAl_{1-x}N/GaN$ [x=(0.18±0.01)] and $Sc_xAl_{1-x}N/GaN$ [x=(0.20±0.01)] heterostructures, respectively.

The polarization induced electron sheet charges $n_s^{\frac{MeAlN}{buffer}}(x)$ which can be reached within specific intervals of barrier alloy compositions, can be approximated by: (given in $10^{13}$ $cm^{-2}$)

$n_s^{\frac{GaAlN}{buffer}}(x) = -0.22x + 6.59(1-x) - 3.19x(1-x), 0.68 \leq x \leq 0.92$ $n_s^{\frac{InAlN}{buffer}}(x) = -7.59x + 6.61(1-x) - 14.00x(1-x), 0.12 \leq x \leq 0.21$ $n_s^{\frac{ScAlN}{buffer}}(x) = -23.87x + 5.62(1-x) + 34.10x(1-x), 0.15 \leq x \leq 0.23$ $n_s^{\frac{InAlN}{buffer}}(x) = -0.10x + 20.10(1-x) - 12.00x(1-x), 0.85 \leq x \leq 0.98$ To demonstrate influence of the Schottky contact on the electron sheet charge of $Ni/Me_xAl_{1-x}N/buffer$ heterostructures, $n_s^{\frac{MeAlN}{buffer}}(d^{MeAlN})$ is calculated by the below equation in an interval of $0 < d^{MeAlN} < 50$ nm for different MeAlN barrier and alloy compositions x:

$n_s^{\frac{MeAlN}{buffer}}(x) = \frac{1}{e}\sigma^{\frac{MeAlN}{buffer}}(x) - \frac{\varepsilon_0 E_F^{buffer}}{e^2}\left(\frac{\varepsilon_{33}^{MeAlN}(x)}{d^{MeAlN}} + \frac{\varepsilon_{33}^{buffer}}{d^{buffer}}\right) =$ $\frac{\varepsilon_0 \varepsilon_{33}^{MeAlN}(x)}{e^2 d^{MeAlN}}\left(e\phi^{MeAlN}(x) + \Delta^{\frac{MeAlN}{buffer}}(x) - \Delta E_C^{\frac{MeAlN}{buffer}}(x)\right)$ For barrier thicknesses larger than a space charge zone, the electron sheet charges are increasing by increasing $d^{MeAlN}$, independent of the alloy composition of MeAlN-barriers. Such an increasing trend is caused by reduced depletion originating from Ni-gate contact, if a distance between the Schottky contact and a position of electron accumulation is enlarged The semiconductor device 100 (or the semiconductor device 300) can be used as a logical inverter. For example, when the semiconductor device 100 acts p-FET, the semiconductor device 100 outputs '1' (high) for an input '0' (low). When the semiconductor device 100 acts n-FET, the semiconductor device outputs '0' for an input '1'. Since the semiconductor device 100 can be used as both n-FET and p-FET, an area of inverter circuit using the semiconductor device 100 is reduced, which in turn reduces a capacitance. Consequently, switching speed is increased. Further, such semiconductor device 100 based inverters can be applied to design of logic gates and other more complex digital circuits.

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicate like elements.

Also, individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Embodiments of the present disclosure may be embodied as a method, of which an example has been provided. The acts performed as part of the method may be ordered in any suitable way. Accordingly, embodiments may be constructed in which acts are performed in an order different than illustrated, which may include performing some acts concurrently, even though shown as sequential acts in illustrative embodiments.

Although the present disclosure has been described with reference to certain preferred embodiments, it is to be understood that various other adaptations and modifications can be made within the spirit and scope of the present disclosure. Therefore, it is the aspect of the appended claims to cover all such variations and modifications as come within the true spirit and scope of the present disclosure.

The invention claimed is:

1. A semiconductor device, comprising:
    a plurality of epitaxial layers including a barrier layer and a channel layer;
    a gate terminal on the barrier layer;
    a set terminal ohmic to the channel layer,
        wherein two-dimensional carrier densities are formed at an interface of the barrier layer and the channel layer,
        wherein a priority of charge carriers of the channel layer is based on a polarization direction of the barrier layer, and
        wherein the polarization direction of the barrier layer is based on a polarity of an electric field across the barrier layer applied between the gate terminal and the set terminal;
    a first source terminal and a second source terminal, wherein the first source terminal is ohmic to electrons and the second source terminal is ohmic to holes; and
    a first drain terminal and a second drain terminal, wherein the first drain terminal is ohmic to the electrons and the second drain terminal is ohmic to the holes.

2. The semiconductor device of claim 1, wherein the barrier layer includes a Scandium-doped Aluminium Nitride (ScAlN) layer.

3. The semiconductor device of claim 1, wherein the channel layer includes Gallium nitride (GaN) layer.

4. The semiconductor device of claim 1, wherein a material of the first source terminal and the first drain terminal is different from a material of the second source terminal and the second drain terminal.

5. The semiconductor device of claim 1, wherein the first source terminal and the first drain terminal are Titanium (Ti) based n-type ohmic contacts.

6. The semiconductor device of claim 1, wherein the second source terminal and the second drain terminal are Nickel (Ni) based p-type ohmic contacts.

7. The semiconductor device of claim 1, wherein the gate terminal is made of one of: Titanium (Ti), Aluminium (Al), Nickel (Ni), Molybdenum (Mo), Tungsten (W), or Platinum (Pt).

8. The semiconductor device of claim 1, wherein the first drain terminal and the second drain terminal are interconnected by an interconnect.

9. The semiconductor device of claim 1, wherein the epitaxial layers are grown on a substrate by Molecular beam epitaxy (MBE), and wherein the substrate is one of a Sapphire substrate, a GaN substrate, a silicon substrate, or a Silicon Carbide (SiC) substrate.

10. A semiconductor device, comprising:
    a plurality of epitaxial layers including a barrier layer and a channel layer;
    a gate terminal on the barrier layer;
    a set terminal ohmic to the channel layer,
        wherein two-dimensional carrier densities are formed at an interface of the barrier layer and the channel layer,
        wherein a priority of charge carriers of the channel layer is based on a polarization direction of the barrier layer, and
        wherein the polarization direction of the barrier layer is based on a polarity of an electric field across the barrier layer applied between the gate terminal and the set terminal;
    a source terminal on the channel layer;
    a drain terminal on the channel layer.

11. The semiconductor device of claim 10, wherein the source terminal and the drain terminal are of same material.

* * * * *